United States Patent
Miyatani (10) Patent No.: US 7,398,064 B2
(45) Date of Patent: Jul. 8, 2008

(54) TRANSMITTING APPARATUS

(75) Inventor: Tetsuhiko Miyatani, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 469 days.

(21) Appl. No.: 11/077,142

(22) Filed: Mar. 11, 2005

(65) Prior Publication Data

US 2005/0277391 A1 Dec. 15, 2005

(30) Foreign Application Priority Data

Jun. 10, 2004 (JP) .............................. 2004-172700

(51) Int. Cl.
*H01Q 11/12* (2006.01)
*H04B 1/04* (2006.01)
(52) U.S. Cl. ................. 455/127.1; 455/126; 455/115.1; 455/522
(58) Field of Classification Search .............. 455/127.1, 455/126, 95, 102, 108, 522, 245.1, 115.1, 455/115.2, 115.4, 127.2, 127.5, 127.3, 69, 455/116, 195.1, 240.1, 343.1; 370/310, 318; 375/295, 296; 398/188, 198; 330/149
See application file for complete search history.

(56) References Cited

U.S. PATENT DOCUMENTS 5,483,373 A * 1/1996 Bulow et al. ................. 398/185

6,603,980 B1 * 8/2003 Kitagawa et al. ............ 455/522
2001/0027113 A1 * 10/2001 Hayashihara ............... 455/522
2004/0124933 A1 * 7/2004 Kang et al. ............. 331/107 SL
2004/0233000 A1 * 11/2004 Stevenson et al. .......... 331/36 C

FOREIGN PATENT DOCUMENTS

| JP | 2002-176368 | 6/2002 |
|---|---|---|
| JP | 2003-046480 | 2/2003 |
| JP | 2003-258683 | 9/2003 |
| JP | 2003-258693 | 9/2003 |
| JP | 2004-500781 | 1/2004 |
| WO | WO 01/73975 | 10/2001 |
| WO | WO2005/002099 | 1/2005 |

* cited by examiner

*Primary Examiner*—John J. Lee
(74) *Attorney, Agent, or Firm*—Crowell & Moring LLP (57) ABSTRACT

The present invention provides a transmitting apparatus equipped with a modulator, a frequency converter that up-converts a modulated signal (or digital IF signal) of a baseband, and an amplifier that amplifies a transmit signal lying in a radio frequency band to a desired signal level. In the transmitting apparatus, a controller including a level determinater and a bias setter is provided with a limiter setter. The level determinater and bias setter of the controller setter perform dynamic bias control of the amplifier. Further, the limiter setter changes the setting of a threshold value of the limiter according to an average level of an input signal.

6 Claims, 7 Drawing Sheets

WHERE OPERATION OF LIMITER IS OBSERVED WITH TIME

FIG. 5  PRIOR ART

EFFECT OF LIMITER (APPEARANCE PROBABILITY CURVE)
(FREQUENCY OF APPEARANCE OF LEVEL GREATER
THAN AVERAGE POWER (0dB) IS CONFIRMED
DEPENDING UPON PRESENCE OR ABSENCE OF LIMITER)

WHERE INPUT SIGNAL LEVEL IS LOW

FIG. 7(b) PRIOR ART

APPLICATION OF DYNAMIC BIAS TECHNIQUE

TRANSMITTING APPARATUS

BACKGROUND OF THE INVENTION

1. Field of the Invention

The present invention relates to a transmitting apparatus used in a wireless transmission system, and particularly to a transmitting apparatus suitable for use in a transmission system which places importance on a reduction in power consumption as an infra-facility.

2. Description of the Related Art

In an electronic device that operates in an analog region, the existence of a nonlinear characteristic is almost inevitable, and its input/output characteristic contains a linear region and a nonlinear region. This particularly presents a problem for a main amplifier (corresponding to a final-stage power amplifier for an RF signal) of a wireless communication transmitting apparatus.

In the case of such an apparatus, the output of the main amplifier is supplied to an antenna and transmitted by radio. Therefore, when a nonlinear region exists in the output, a harmonic due to nonlinear distortion is produced and exerts an influence on a transmission system in an adjacent frequency band as spurious radiation, thereby causing a fear of interfering with other transmission system. Therefore, the nonlinear distortion is placed under strict control.

Meanwhile, in order to suppress the nonlinear distortion, the electronic device such as the main amplifier may be used in a linear region alone. Since, however, the linear region generally stays within a range in which an input level is low, power efficiency (output power/power consumption) of the amplifier is reduced where it is operated only in the linear region. Consequently, energy saving cannot be obtained in the case of the main amplifier.

Thus, a large challenge for a transmitting apparatus is how to improve power efficiency while suppressing the nonlinear distortion. On the other hand, as a technique that will bring about the attainment of this challenge, there is first considered the application of a limiter (refer to, for example, a patent document 1 (Japanese Patent Laid-Open No. 2003-46480) or (Japanese Patent Laid Open No. 2003-258683). Now, the present limiter means an amplitude limiting circuit which is also called limiter. In the present specification, however, it will be explained as one unified as the limiter.

Figure 3A:
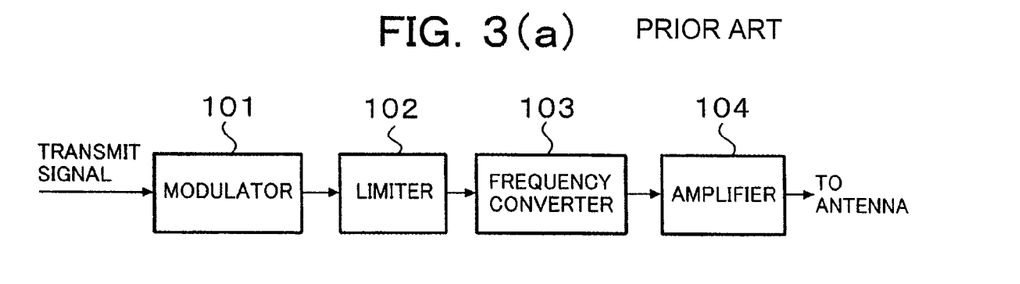
FIG. 3 is an explanatory diagram of a transmitting apparatus according to a prior art.

FIG. 3(a) shows one example of a transmitting apparatus according to a prior art, which is equipped with a limiter. As illustrated in the figure, the transmitting apparatus comprises a modulator 101, a limiter 102 which suppresses peak power of a modulated signal, a frequency converter 103 which up-converts a modulated signal (or digital IF signal) of a baseband to a radio frequency band (converts it to a high frequency), and an amplifier 104 which amplifies a transmit signal lying in a radio frequency band to a desired signal level and supplies it to an antenna. Thus, the present amplifier 104 corresponds to the main amplifier referred to above.

Figure 4:
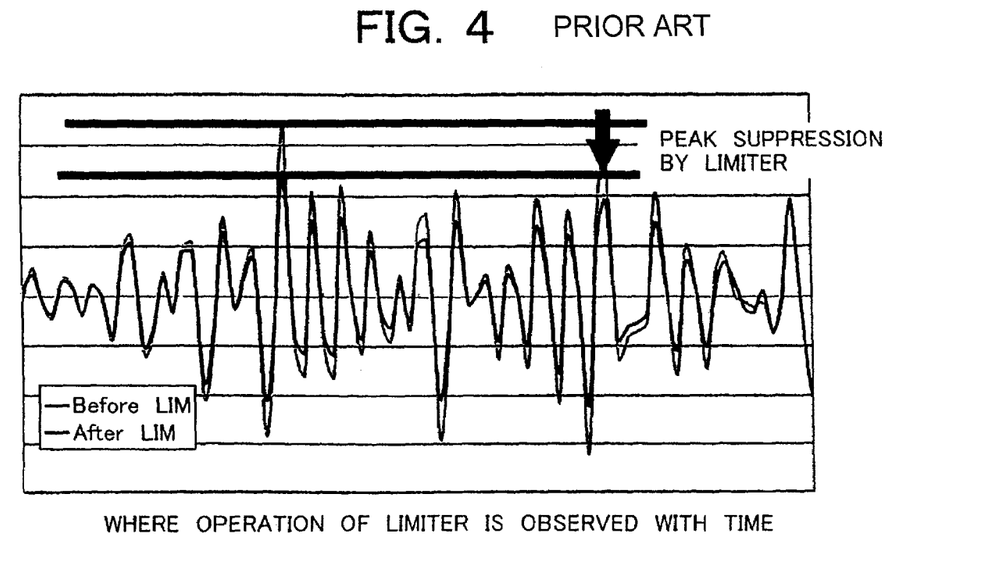
FIG. 4 is a characteristic diagram for describing the operation of a limiter employed in the transmitting apparatus according to the prior art.

In this case, the limiter 102 functions so as to limit the amplitude of the modulated signal outputted from the modulator 101 to a certain predetermined voltage (called threshold value Vth) and suppress a momentary high level region (peak level) that appears in the input of the amplifier 104 as shown in FIG. 4.

Figure 5:
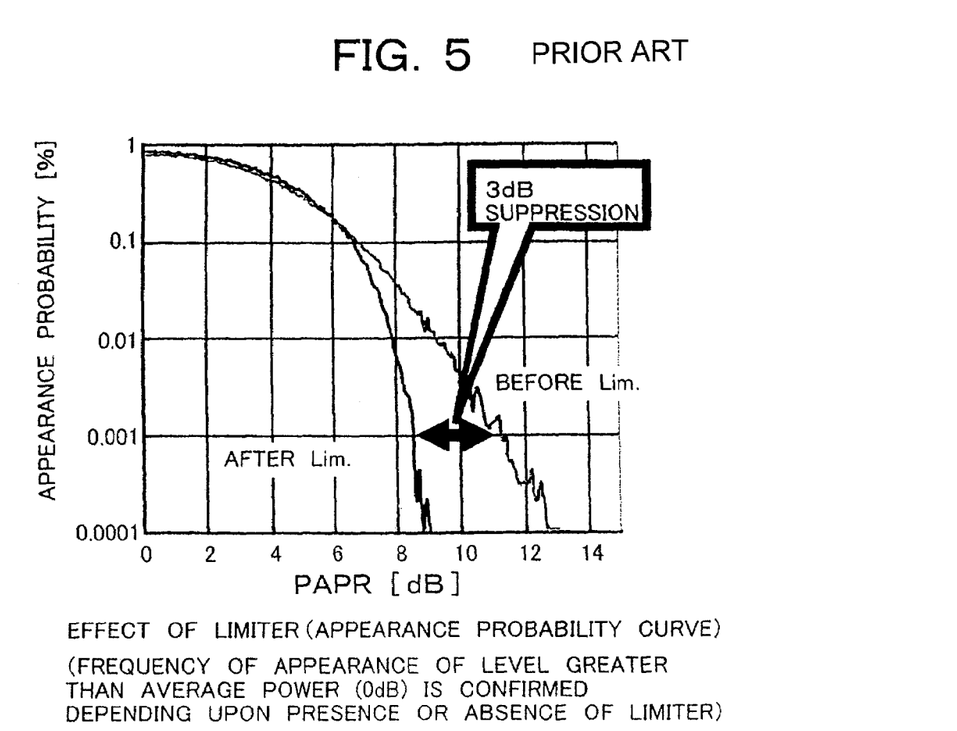
FIG. 5 is a characteristic diagram for describing the operation of the limiter employed in the transmitting apparatus according to the prior art in a manner similar to FIG. 4.

The effect shown in FIG. 4, of the limiter, which can be confirmed in another form, corresponds to an appearance probability characteristic shown in FIG. 5. In the present figure, the horizontal axis indicates a peak to average power ratio (PAPR: abbreviation of Peak to Average Power Ratio), and the vertical axis indicates appearance probability. It is well understood from the characteristic of FIG. 5 that the peak power has been suppressed by the limiter as is apparent from comparison between characteristics prior and subsequent to the passage thereof through the limiter.

Figure 6A:
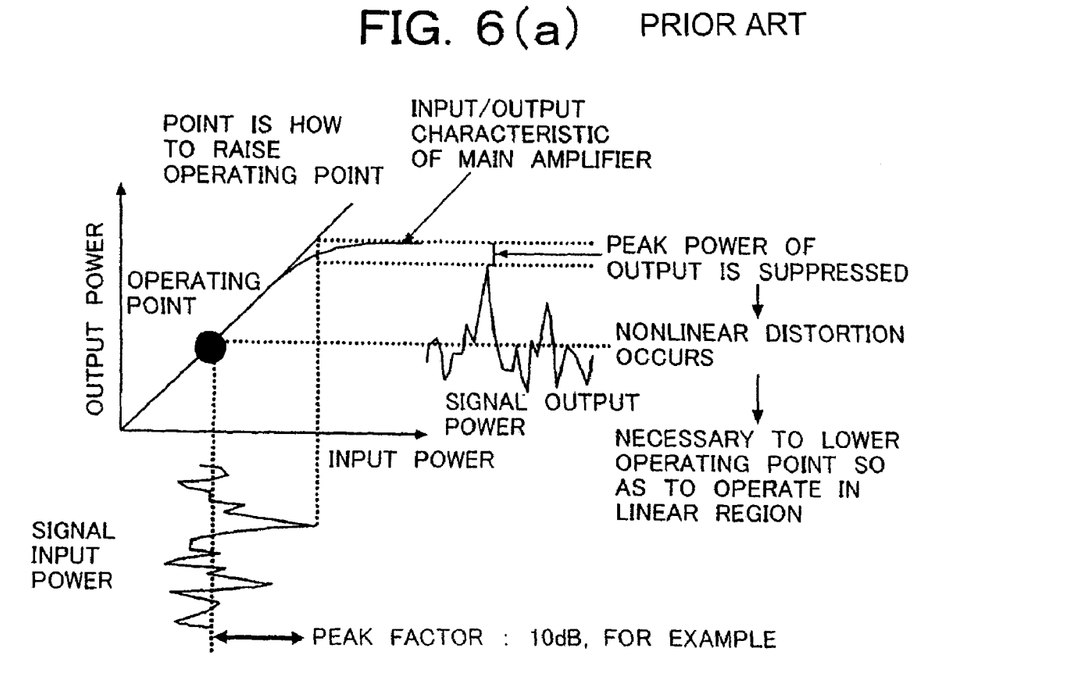
FIG. 6 is an explanatory diagram showing the relationship between non-linearity of an amplifier and the limiter.
Figure 6B:
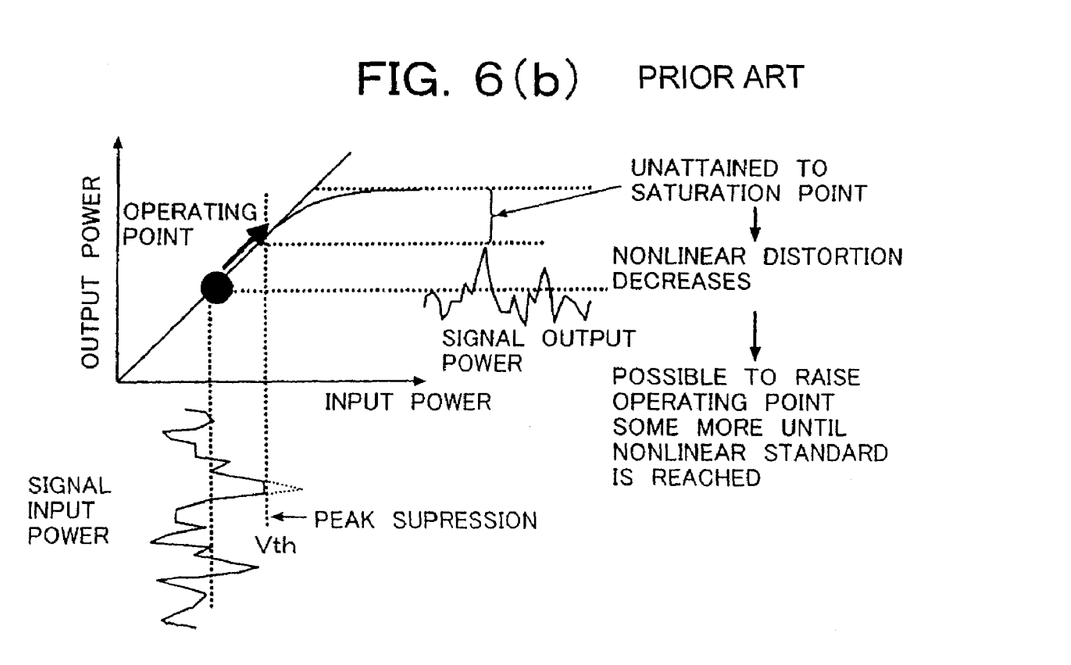

The relationship between the nonlinearity of such an amplifier and the limiter is further well-shown in FIG. 6. FIG. 6(a) shows a case in which no limiter is provided, and FIG. 6(b) shows a case in which the limiter exists. Referring first to FIG. 6(a), a nonlinear region of an input/output characteristic of the amplifier is made active when signal input power reaches a peak, so that nonlinear distortion occurs.

On the other hand, when the limiter exists as shown in FIG. 6(b), the peak of the signal input power is suppressed by the limiter. Therefore, only a linear region of an input/output characteristic of the main amplifier can be made active. As a result, since the nonlinear distortion is reduced, the operating point of the input/output characteristic can be deepened correspondingly, thus making it possible to improve the power efficiency of the amplifier.

Next, as a technique that contributes to an improvement in power efficiency of the amplifier, may be mentioned the application of a dynamic bias technique in addition to the above (refer to, for example, a patent document 3 (Japanese Patent Laid-Open No. 2002-176368) or 4 (Japanese Patent Publication No. 2004-500781)).

Figure 3B:
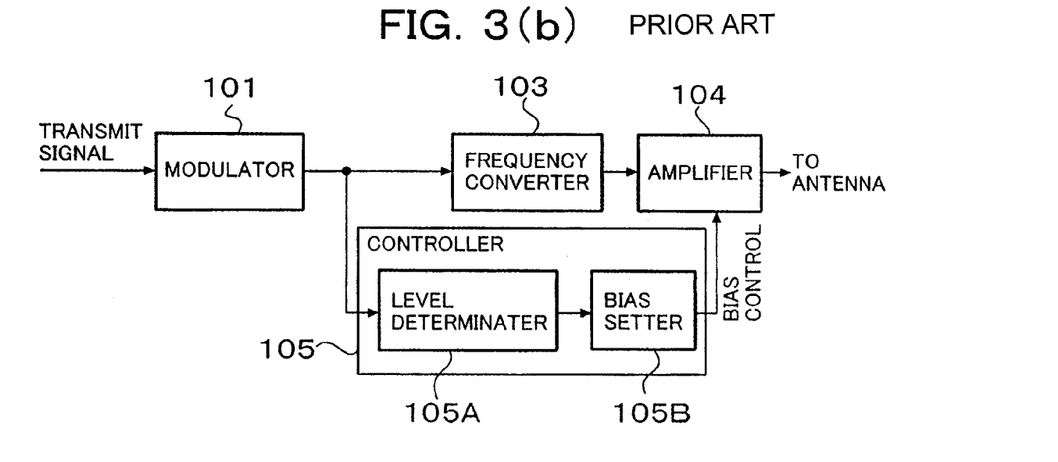

Now, FIG. 3(b) shows one example of a transmitting apparatus according to a prior art, to which the present dynamic bias technique is applied. As shown in the figure, the present transmitting apparatus is identical to the prior art of FIG. 3(a) in that the former is provided with a modulator 101, a frequency converter 103 that up-converts a modulated signal (or digital IF signal) of a baseband, and an amplifier 104 which amplifies a transit signal lying in a radio frequency band to a desired signal level.

In FIG. 3(b), however, a controller 105 is further provided. On the other hand, the limiter 102 shown in FIG. 3(a) is omitted.

As shown in the figure, the controller 105 is provided with a level determinater 105A and a bias setter 105B. The level determinater 105A determines (detects) an average level of a modulated signal outputted from the modulator 101. Then, the bias setter 105B sets bias of the amplifier 104 in accordance with the result of determination (detection) thereby to obtain control by the dynamic bias technique, i.e., dynamic bias control.

Here, the dynamic bias control, if described intelligibly, means control for operating an amplifier whose original maximum output is, for example, 100 W, as an amplifier whose maximum output is 50 W, or operating it as an amplifier whose maximum output is 10 W.

Figure 7A:
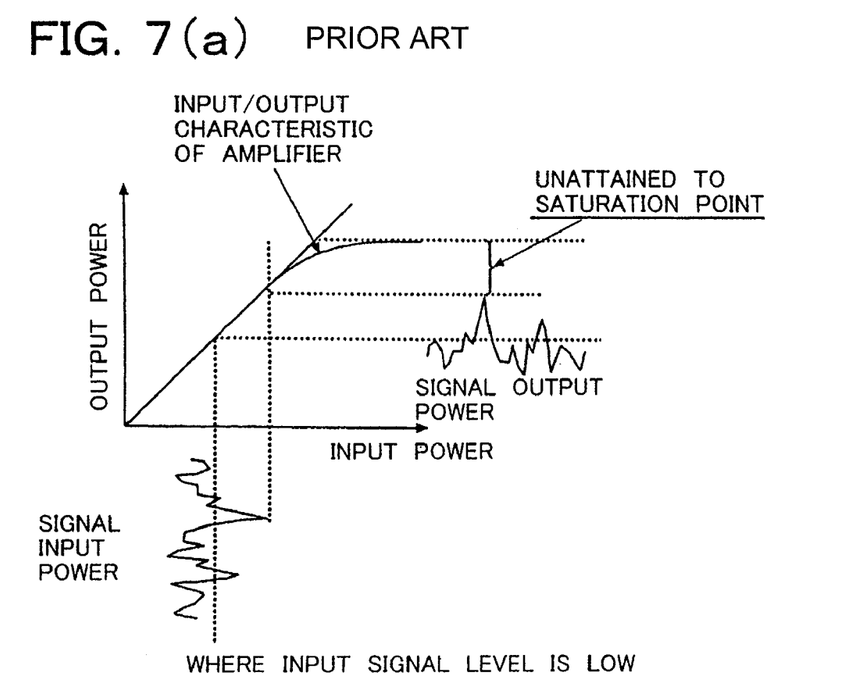
FIG. 7 is a diagram for describing dynamic bias control.

Let's now assume that there is an amplifier having such an input/output characteristic as shown in FIG. 7(a), and when the average level of an input signal is increased to a saturated region of the input/output characteristic in this case, i.e., the amplifier is excited up to the full dynamic range, the maximum output, i.e., the original maximum output is 100 W, for example.

Assuming, in this case, that as shown in the figure, the average level of the input signal is low and an operating range does not reach a saturation point, the expected dynamic range is not utilized and goes to not only waste but also a loss in power consumption. Thus, this runs counter to an improvement in power efficiency.

Figure 7B:
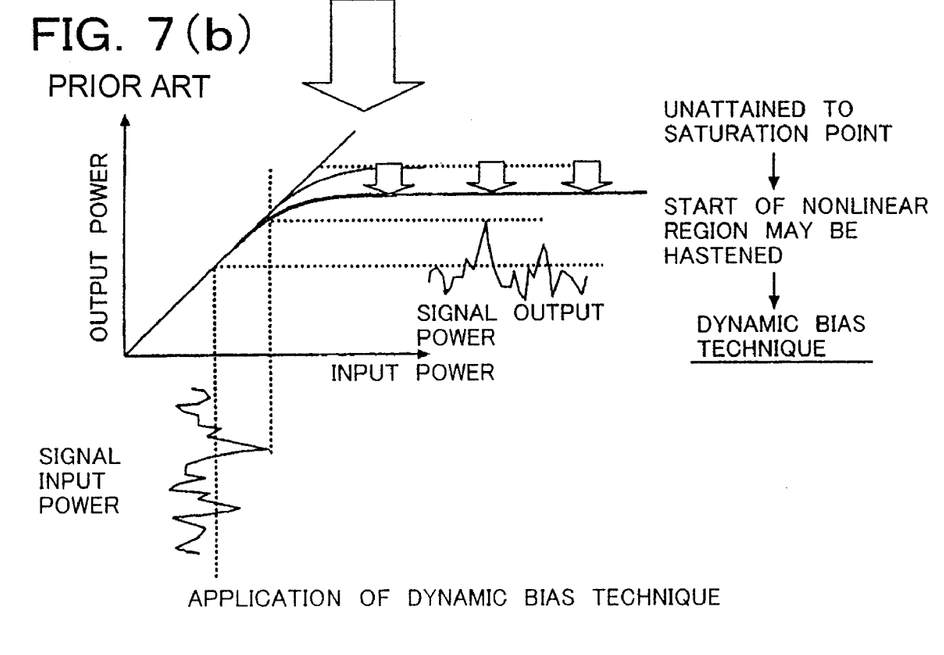

Thus, in such a case, a source voltage or power supply voltage (or source current) of the amplifier is restricted according to the average level of the modulated signal outputted from the modulator 101 to lower the saturation point of the input/output characteristic as shown in FIG. 7(b) and set the maximum output to, for example, 50 W. If done in this way, then power consumption is suppressed and the power efficiency can be improved.

This is called dynamic bias control. In brief, it indicates such control that the source voltage (or source current) of the amplifier is controlled according to the input level and the maximum output of the amplifier is restricted depending upon the average level of the input.

The dynamic bias control is generally utilized in mobile communications or the like where the average level of the input signal greatly changes. This is because the traffic is low from midnight to early morning or the like and the average level of a signal at this time is commonly far inferior to the pre-estimated saturation power (corresponding to the maximum output impossible to output any longer) of the amplifier.

It will be also described intelligibly. Since the traffic increases in the daytime, for example, the average level of the input is also high and hence an output of 50 W, for example, is required. When, however, the average level is reduced late at night and even an output of 1 W is enough, it is useless to use the 100W amplifier as it is.

Thus, in this case, the source voltage or current of the amplifier is restricted by the dynamic bias control and the amplifier is operated as the 100 W amplifier when 50 W is required, for example. If the amplifier is controlled in such a manner that it is operated as a 10 W amplifier when 1 W is required, then power consumption is reduced, thus making it possible to improve power efficiency and make a contribution to energy saving.

Figure 3C:
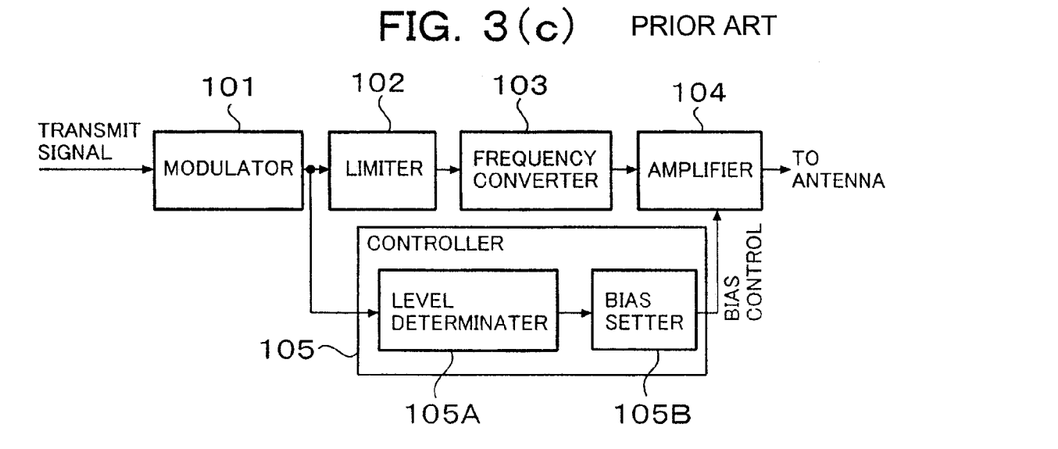

Meanwhile, since there is no limitation to energy saving, a transmitting apparatus utilizing the above limiter and dynamic bias control in combination has been estimated as the prior art as shown in FIG. 3(c) with a view of aiming at a further reduction in power consumption. This is however equivalent to one wherein the transmitting apparatus shown in FIG. 3(b) is provided with the limiter 102 of the transmitting apparatus shown in FIG. 3(a). Other configurations remain unchanged.

However, the transmitting apparatus of FIG. 3(c) utilizing the limiter and dynamic bias control in combination in this way involves problems to be described below.

As already described, when power (or voltage) to be handled exceeds the threshold value, the limiter restricts the exceeded power (or voltage). Therefore, the limiter essentially corresponds to the nonlinear device itself. When the power (or voltage) level is increased where the power (or voltage) is greatly restricted, the rate of distortion of a signal increases and hence the prescribed signal quality cannot be maintained.

That is, since the distortion rate increases when the threshold value of the limiter 102 is reduced in the prior art, there is a limit to a reduction in threshold value although it is done to increase the efficiency of the amplifier. Thus, the threshold value should unavoidably be set to a threshold value corresponding to a value larger than some degree in the case of the transmitting apparatus shown in FIG. 3(c).

Figure 8:
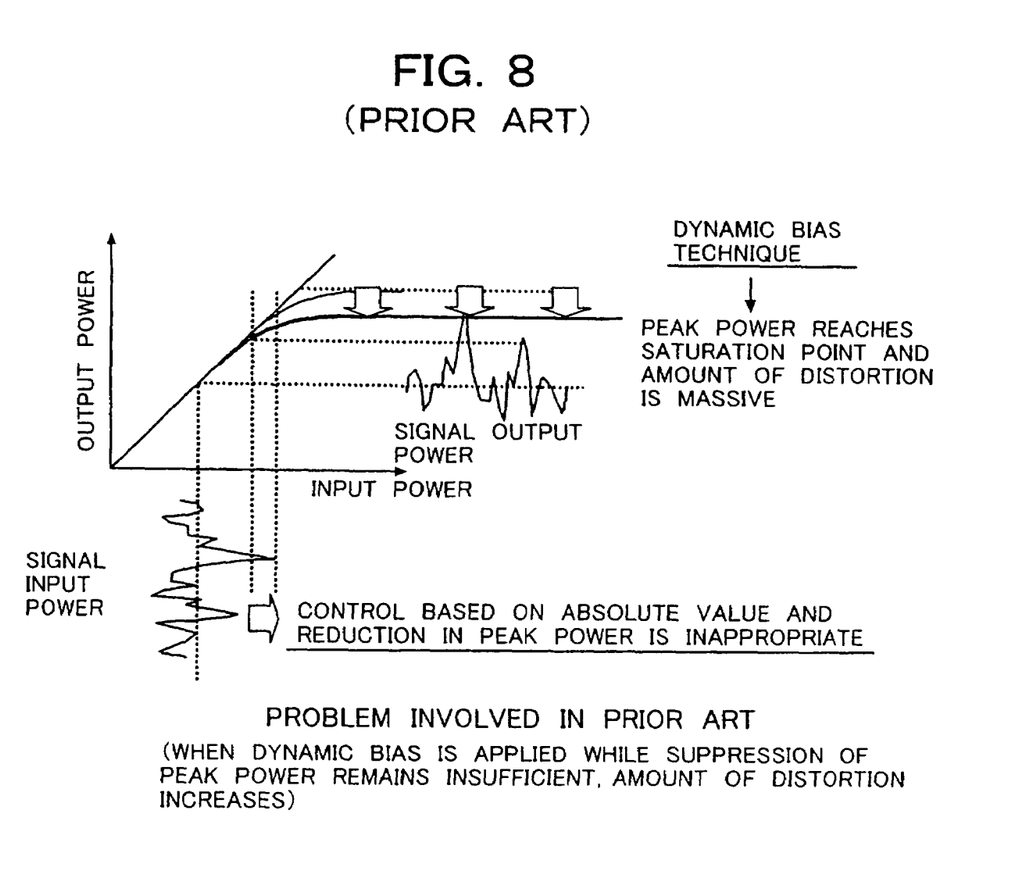
FIG. 8 is a diagram for explaining problems involved in the prior art which utilizes the limiter and the dynamic bias control in combination.

Therefore, a problem arises in that when the dynamic bias control and the limiter are thus utilized in combination in a state in which the threshold value of the limiter is above some degree, in other words, the limitation made by the limiter is not so effective, the amplitude of the signal is inputted up to the saturation point of the input/output characteristic reduced by the dynamic bias control as shown in FIG. 8, thereby generating large nonlinear distortion.

SUMMARY OF THE INVENTION

An object of the present invention is to provide a transmitting apparatus which utilizes a limiter and dynamic bias control in combination to obtain a reduction in power consumption.

In order to attain the above object, there is provided a transmitting apparatus comprising a bias setter which performs dynamic bias control in accordance with an average level of an input signal, an amplifier subjected to the dynamic bias control by the bias setter, a limiter which limits a peak that appears in the input signal of the amplifier, and a limiter setter which sets a threshold value of the limiter in accordance with the average level of the input signal, wherein the limiter setter lowers the threshold value of the limiter when a saturation point of the amplifier is lowered by the dynamic bias control.

At this time, in order to attain the above object, preferably, a controller including the level determinater and the bias setter is provided with a section for inputting a control permit signal that permits the operation of the dynamic bias control.

Also in order to attain the above object, preferably, a controller including the level determinater and the limiter setter is provided with a section for inputting a control permit signal that permits the operation of the limiter.

Likewise, at this time, in order to attain the above object, preferably, means which determines whether at least one of the dynamic bias control and the operation of the limiter is enabled, and means which stops the dynamic bias control and the operation of the limiter at a level in the neighborhood of a maximum output of the amplifier are provided.

Further, at this time, in order to attain the above object, preferably, a level determinater which determines an average level of a signal prior to being inputted to the limiter is provided, and the limiter setter and the bias setter are operated based on the average level outputted from the level determinater.

Here, in order to attain the above object, preferably, the saturation point of the amplifier lowered by the dynamic bias control and the threshold value of the limiter are proportional within a range in which the average level is determined in advance.

According to the present invention, a reduction in power consumption due to the combined use of a limiter and dynamic bias control can be obtained with no increase in the rate of distortion and hence energy saving can be sufficiently achieved.

Other features and advantages of the present invention will become apparent upon a reading of the attached specification.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which.

DETAILED DESCRIPTION OF THE PREFERRED EMBODIMENTS

A transmitting apparatus according to the present invention will hereinafter be described in detail in accordance with an illustrated embodiment.

Figure 1:
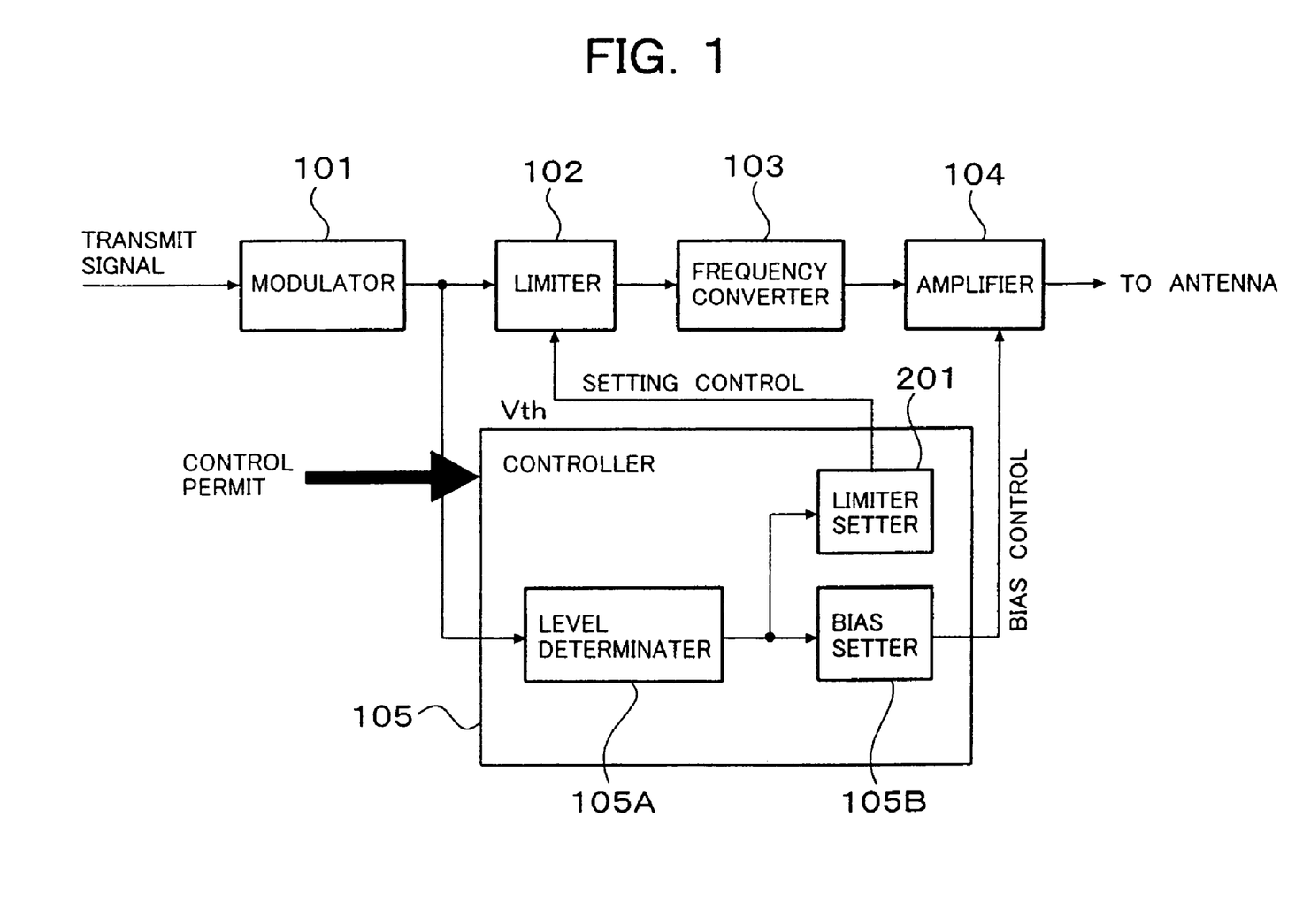
FIG. 1 is a block diagram showing one embodiment of a transmitting apparatus according to the present invention.

Now, FIG. 1 shows one embodiment according to the present invention. In this figure, reference numeral 201 indicates a limiter setter. In addition to it, a modulator 101, a limiter 102, a frequency converter 103, an amplifier 104, a level determiner 105A included in a controller 105, and a bias setter 105B similarly included therein are respectively identical to those employed in the transmitting apparatus shown in FIG. 3(c).

A specific configuration of the limiter may be identical to ones described in the aforementioned patent documents 1 and 2 and the international patent application PCT/JP2004-007868. They are a simple hard limiter system wherein the amplitude peak greater than the threshold value is clipped to the threshold value or a window system wherein as shown in FIG. 4, the neighborhood (e.g., about 100 symbols) of the peak greater than the threshold value is multiplied by a window function to smoothly suppress the peak, etc. However, the threshold value Vth is set changeably without fixing.

At this time, in the present embodiment, the controller 105 is constituted of a CPU (Central Processing Unit), and the level determiner 105A and the bias setter 105B, and the limiter setter 201 are constructed of software. Even in the present embodiment, the level determiner 105A is to determine an average level (moving average level) of a modulated signal outputted from the modulator 101.

Thus, the limiter setter 201 functions so as to input the result of determination (detection) of the average level from the level determiner 105A as illustrated in the figure, generate a predetermined voltage in accordance with it and set the predetermined voltage as the threshold value Vth of the limiter 102.

At this time, the output of the level determiner 105A is supplied even to the bias setter 105B. Thus, as described above, the saturation point of an input/output characteristic of the amplifier 104 is controlled depending upon control based on the dynamic bias control, i.e., the average level of the modulated signal outputted from the modulator 101 so that control for changing the maximum output is executed.

As a result, the level of a transmit signal inputted to the modulator 101 changes even in the embodiment shown in FIG. 1. When the average level of the modulated signal outputted from the modulator 101 changes, the saturation point of the input/output characteristic of the amplifier 104 is controlled correspondingly so that control for changing the maximum output is executed. In the present embodiment, however, control for changing the threshold value Vth of the limiter 102 is also further carried out together with the above control.

As already described, the dynamic bias control is applied where the average level of the input signal is low as compared with the saturation point of the amplifier 104, i.e., where the average level of the modulated signal outputted from the modulator 101 is low. The maximum output is reduced depending upon the average level of the modulated signal.

There was conventionally a case where when the threshold value Vth of the limiter 102 was higher than the average level of the modulated signal, the operating point entered the saturated region of the amplifier 104 before the peak level of the modulated signal did not reach the threshold value Vth.

There was also a case in which when the threshold value Vth of the limiter 102 was lower than the average level of the modulated signal in reverse, the unnecessary limiter would function even with respect to a linear region secured by the dynamic bias control.

In the embodiment shown in FIG. 1, however, when, at this time, the threshold value Vth of the limiter 102 is controlled by the limiter setter 201 and the average level of the modulated signal is lowered, the threshold value Vth is changed in the direction to further suppress the modulated signal, that is, the threshold value Vth is changed in the direction in which depending upon a reduction in the average level of the modulated signal, it is lowered identically.

When the average level of the modulated signal increases in reverse, the threshold value Vth is changed in the direction to raise the suppressed level of the modulated signal, that is, the threshold value Vth is changed in the direction in which depending upon an increase in the average level of the modulated signal, it is increased identically.

Figure 2A:
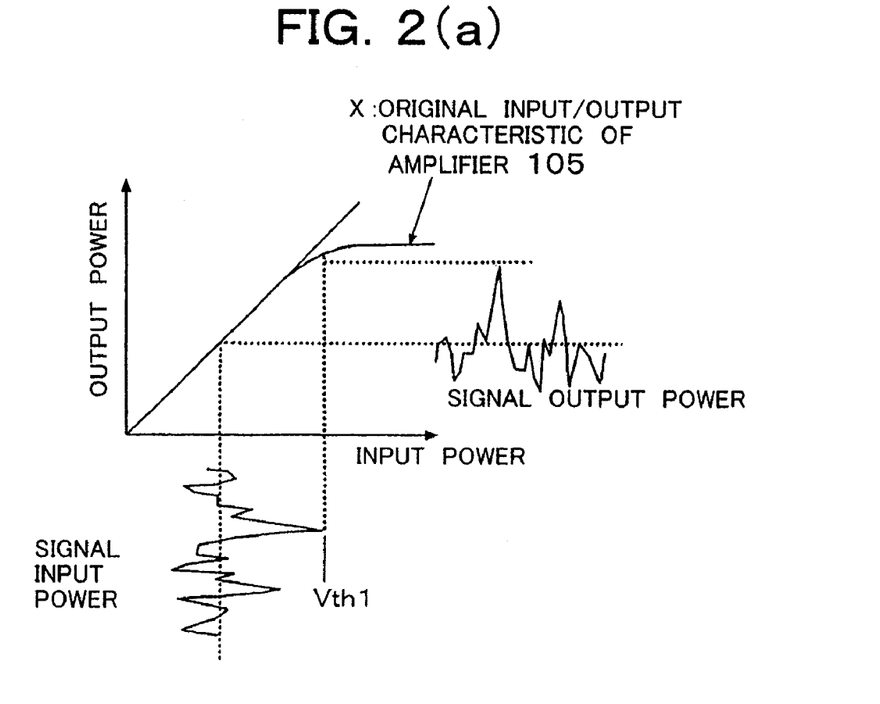
FIG. 2 is a characteristic diagram for explaining the operation of one embodiment of the present invention.

The operation of the present embodiment at this time will be explained with reference to FIG. 2. Now, firstly, FIG. 2(a) shows a case in which the average level of signal input power is relatively large and the level at its peak is brought into such a state as to reach the saturation point of the original input/output characteristic of the amplifier 104. Next, FIG. 2(b) shows a case in which the average level of the signal input power is relatively low and the level at its peak is brought into such a state as not to reach the saturation point of the original input/output characteristic of the amplifier 104.

Since the average level of the signal input power is relatively large in FIG. 2(a), a change in the input/output characteristic of the amplifier 104 due to the dynamic bias control does not take place and hence its input/output characteristic thereof remains at the original characteristic.

Thus, at this time, the limiter setter 201 sets, to the limiter 102, a threshold value Vth1 necessary to put restrictions by the limiter 102 at the peak level of the signal input power corresponding to the saturation point of the original input/output characteristic of the amplifier 104 in the above case.

Figure 2B:
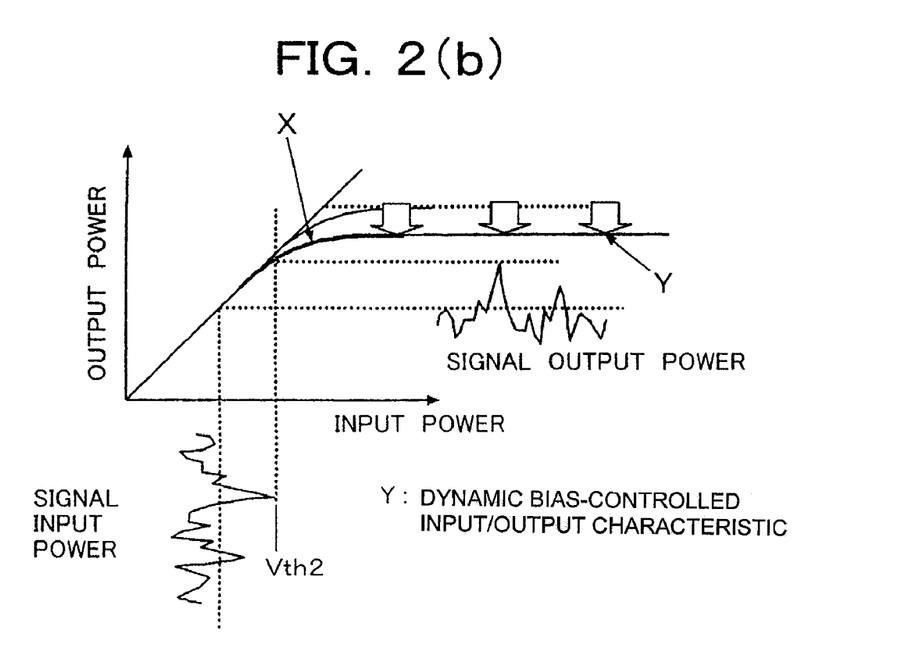

On the other hand, since the average level of the signal input power is relatively small in FIG. 2(b), a change in the input/output characteristic of the amplifier 104 due to the dynamic bias control occurs and hence the input/output characteristic thereof is brought to such an input/output characteristic that the saturation point is lowered from the original characteristic as illustrated in the figure, depending upon the average level of the signal input power at this time.

Consequentially, the limiter setter 201 next sets, to the limiter 102, a threshold value Vth2 necessary to put restrictions by the limiter 102 at the peak level of the signal input power corresponding to the saturation point of the input/output characteristic of the amplifier 104 reduced in saturation point at this time. It is therefore needless to say that a relationship of (Vth1>Vth2) is established between these threshold values Vth1 and Vth2.

The relationship of the input/output characteristic of the amplifier 104 with the average level of the signal input power under the dynamic bias control at this time, and likewise the relationship of the threshold value Vth with the average level of the signal input power at the limiter 102 are determined in advance and tabulated in consideration of signal quality required of the present transmitting apparatus, the ratio of a peal level to the average level of the signal input power handled by the present transmitting apparatus, etc., followed by being stored in a memory provided in the CPU of the controller 105.

Each time the average level is supplied from the level determinater 105A, the bias setter 105B and the limiter setter 201 retrieve each table according to the average level at that time. Then, the bias setter 105B executes bias control in accordance with the input/output characteristic of the amplifier 105, which is given as the result of retrieval of each table. The limiter setter 201 sets a voltage given as the result of retrieval to the limiter 102 as the threshold value Vth.

One configurational example of the simplest table is one which sets the average level of input signal power as an argument, gives a threshold value Vth proportional to the average level (assumed to be a linear scale equivalent to amplitude) in a region in which the average level is small as shown in FIG. 2(b), and applies such a bias voltage as to reach a saturation point proportional to the average level. Thus, the saturation point of the amplifier 104 can hold a constant margin (inclusive of 0 or negative margin too) against the peak.

However, the threshold value Vth and the bias voltage may be held constant in a region in which the average level is small in particular. Using each table with the average level and temperature as arguments with respect to the bias voltage even in the present invention as in the case in which the bias voltage has heretofore been applied corresponding to the temperature of the amplifier 104 enables prevention of the effect of temperature. Alternatively, the bias may be feedback-controlled in such a manner that the tables are not used and the bias current (source current) actually measured as in the aforementioned patent document 4 (WO2001/073975) is proportional to the average level.

Thus, according to the present embodiment, when the saturation point of the input/output characteristic of the amplifier 104 is controlled by the dynamic bias control, the threshold value Vth of the limiter 102 is also controlled correspondingly. It is therefore possible to suppress the occurrence of nonlinear distortion due to a variation in the average level of the transmit signal and provide compatibility between energy saving by application of the dynamic bias control while the required signal quality remains held and energy-saving by application of the limiter.

At this time, the present embodiment has the advantages that since the controller 105 is constituted of CPU as described above, there is little increase in hardware due to the addition of the limiter setter 201 and hence a rise in cost is slight.

In the present embodiment in the meanwhile, a control permit signal can be inputted to the controller 105 as indicated by arrow in FIG. 1. Only when the control permit signal is inputted, the controller 105 is enabled to allow the application of the dynamic bias control and the limiter to stop arbitrarily.

As a preferred form of the control permit signal at this time, may be mentioned enable/disable control as to whether the dynamic bias control can be executed. The origin of issuance of the control signal may be an upper or high-level controller that controls the present transmitting apparatus or a timer mounted to the present transmitting apparatus.

Let's now assume that the control permit signal is not inputted. In this case, the dynamic bias control results in having been always executed depending upon the level of the input signal. At this time, the dynamic bias control is essentially of nonlinear control. Therefore, problems are involved although an improvement in power efficiency is anticipated.

In general, a nonlinear amplifier has a nonlinear characteristic fixed under bias control. Since the nonlinear amplifier is of an analog device at this time, the nonlinear characteristic thereof changes according to the temperature and frequency. However, there is a tendency to stabilize its nonlinear characteristic where a bias current is increased here. However, the efficiency of power is reduced as a matter of course.

Thus, assuming that bias setting is caused to change depending upon conditions such as the dynamic bias control, the nonlinear characteristic dynamically changes and hence an apparatus that has met a wireless characteristic standard up to now becomes occasionally out of standard. Thus assuming that it is caused to follow an input power level frequently, a problem becomes easy to occur in this case. Therefore, it is undesirable to perform the dynamic bias control when the difference between estimated input power and actual input power is not so large. Incidentally, it is a reason why the dynamic bias control has not been evaluated so much up to now.

According to the present embodiment, however, the enable/disable control for the dynamic bias control can be carried out as needed. It is therefore possible to make compatibility between energy-saving based on the application of the dynamic bias control and energy-saving based on the application of the limiter with the required signal quality held as it is while utilizing the advantage of the dynamic bias control.

Now, when the origin of issuance of the control permit signal is of an upper controller for the transmitting apparatus according to the present embodiment, such as a base station, the transition of a traffic in the system has been revealed as a matter of course. Thus, it is of course possible to issue the control permit signal in accordance with the transition (equivalent to a change in low speed rather than a change in input signal) of the traffic. It is also possible to issue the control permit signal only in the overnight/early-morning timezones and carry out the bias control, as previously mentioned in the case of the timer-based control referred to above.

At this time, a control signal itself may be inputted to the controller 105 as an alternative to the control permit signal. Here, the control signal means the input/output characteristic of the amplifier 105, which is given to the bias setter 105B as the result of retrieval of the table, and the threshold value Vth applied to the limiter setter 201 as the result of retrieval of the table in like manner.

Meanwhile, in the present embodiment, it is also important to perform not only control as to whether the dynamic bias control can be performed, but also control as to whether the application of the limiter is enabled. Even though peak power has already been suppressed to a problem-free degree on the basis of the input/output characteristic whose saturation point has been lowered by dynamic bias, as already described in accordance with the prior art, for example, the occurrence of deterioration in signal quality due to a limiter operation is held as is, setting aside a reduction in peak power. That is, this results in a change in signal quality to no purpose.

Therefore, the present embodiment is constructed in such a manner that a decision as to whether the limiter can be applied based on the control permit signal is also performed. In doing so, according to the present embodiment, the threshold value of the limiter can be fixed to the maximum and hence the above needless limiter operation can be suppressed at random. Thus, according to the present embodiment, the above simple change makes it possible to obtain a stable wireless characteristic even under a dynamic bias environment that could be a relatively instable factor.

Incidentally, although the dynamic bias control exerts the effect of reducing power consumption as described up to now, there is a case in which the distortion characteristic becomes instable. The amount of distortion at this time becomes the largest as a matter of course where the amplifier is operated at the maximum output. Therefore, there is a fear that assuming that the dynamic bias control is executed, it falls below the wireless characteristic standard in some cases even in the neighborhood of the maximum output.

Thus, in order to avoid the occurrence of such a situation, one embodiment of the present invention is constituted so as to stop the application of the dynamic bias control and the limiter in the neighborhood of the maximum output. Described specifically, the level in the neighborhood of the maximum output at the stop of the application of the dynamic bias control and the limiter is set to the CPU of the controller 105 as a stop level in advance. When the maximum level of the input/output characteristic set to the amplifier 104 by the bias setter 105B exceeds the stop level, the threshold value Vth of the limiter 102, which is set by the limiter setter 201, is set to the maximum value.

The stop level at this time may be determined from the maximum permissible power (saturation power) of the amplifier 104, for example. On the other hand, in the transmitting apparatus according to the present embodiment, the stop level might be used in a digital transmission system using a plurality of carriers. In this case, the stop level may be decided depending upon how the transmitting apparatus has the number of carriers.

In the case of a 2-carrier type digital transmission system, for example, a stop level is set in such a manner that dynamic bias and limiter threshold change control are not performed unless it reaches one half or less of the maximum permissible power of the amplifier 104. In the case of a 4-carrier type digital transmission system, a stop level is set in such a manner that the above control is not performed unless it reaches less than or equal to one fourth the maximum permissible power.

The present invention particularly brings about a noticeable effect where the level determiner for supplying the average level to the limiter setter and bias setter is commonly provided for the limiter setter and the bias setter. The present invention is not limited to it. A level determiner for supplying the average level to the bias setter on the basis of an input signal subsequent to the limiter may be provided as a separate one.

Meanwhile, the transmitting apparatus for which the present invention is intended, brings about a profound effect by being used in its base station device in particular in a cellular mobile communication environment. Thus, the application of the transmitting apparatus according to the embodiment to a transmitter of the base station device makes it possible to reduce operational cost.

This is because the infracost finally becomes a burden on a user in the case of the mobile communication environment. Thus, an advantageous effect can be expected particularly in this case.

While the preferred forms of the present invention have been described, it is to be understood that modifications will be apparent to those skilled in the art without departing from the spirit of the invention. The scope of the invention is to be determined solely by the following claims.

What is claimed is:

1. A transmitting apparatus comprising:
    a bias setter which performs dynamic bias control in accordance with an average level of an input signal;
    an amplifier subjected to the dynamic bias control by said bias setter;
    a limiter which limits a peak that appears in the input signal of said amplifier; and
    a limiter setter which sets a threshold value of said limiter in accordance with the average level of the input signal,
    wherein said limiter setter lowers the threshold value of said limiter when a saturation point of said amplifier is lowered by the dynamic bias control.

2. The transmitting apparatus according to claim 1, wherein a controller including said level determinater and said bias setter is provided with a section for inputting a control permit signal that permits the operation of the dynamic bias control.

3. The transmitting apparatus according to claim 1, wherein a controller including said level determinater and said limiter setter is provided with a section for inputting a control permit signal that permits the operation of said limiter.

4. The transmitting apparatus according to claim 1, further comprising:
    means which determines whether at least one of the dynamic bias control and the operation of said limiter is enabled; and
    means which stops the dynamic bias control and the operation of said limiter at a level in the neighborhood of a maximum output of said amplifier.

5. The transmitting apparatus according to claim 1, further comprising a level determinater which determines an average level of a signal prior to being inputted to said limiter,
    wherein said limiter setter and said bias setter are operated based on the average level outputted from said level determinater.

6. The transmitting apparatus according to claim 5, wherein the saturation point of said amplifier lowered by the dynamic bias control and the threshold value of said limiter are proportional within a range in which the average level is determined in advance.

* * * * *